United States Patent [19]
Behr et al.

[11] Patent Number: 6,155,723
[45] Date of Patent: Dec. 5, 2000

[54] ELECTRONIC INPUT/OUTPUT MODULE

[75] Inventors: Thorsten Behr, Horn-Bad Meinberg; Roland Berg, Lemge; Jürgen Brand, Detmold; Achim Fürhoff, Kirchlengern; Harald Grewe, Bad Lippspringe; Frank Hannibal, Blomberg; Andreas Metzger, Detmold; Werner Neugebauer; Andreas Nordhoff, both of Horn-Bad Meinberg; Viktor Oster, Blomberg; Andreas Pape, Brakel; Dirk Quardt, Schieder-Schwalenberg, all of Germany

[73] Assignee: Phoenix Contact GmbH & Co., Blomberg, Germany

[21] Appl. No.: 09/166,941

[22] Filed: Oct. 6, 1998

[30]     Foreign Application Priority Data

Oct. 6, 1997 [DE]  Germany .............. 197 43 972

[51] Int. Cl.⁷ ................................................ G02B 6/36
[52] U.S. Cl. .................................... 385/88; 439/577
[58] Field of Search ............... 385/24, 88, 92, 385/134, 135, 139; 439/44, 47, 577

[56]         References Cited

U.S. PATENT DOCUMENTS 4,768,961  9/1988  Lau ............................................. 439/61
5,472,347  12/1995  Nordenstrom et al. .................... 439/61
5,984,734  11/1999  Piper et al. ............................. 437/717

FOREIGN PATENT DOCUMENTS 39 18 517    6/1990   Germany .
44 12 270   10/1995   Germany .
195 12 110  10/1996   Germany .

*Primary Examiner*—John D. Lee
*Assistant Examiner*—Sarah N Song
*Attorney, Agent, or Firm*—Nixon Peabody LLP; David S. Safran

[57]                ABSTRACT

An input/output module (1) with a terminal unit (2) for connection of sensors or actuators with an electronic unit (3) and with a bus connection element (4). The terminal unit (2) has at least one input/output (5) located in a surface thereof and the terminal unit is connected by the electronic unit (3) to the bus connection element (4). To replace the electronic unit (3), the terminal unit (2) can be removed from the electronic unit (3) without the need to remove lines (6) connected to the inputs/outputs (5). The terminal unit (2) is able to be mounted to the electronic unit (3) in each of two positions, the input/output (5) in the two positions lying in planes that are offset relative to each other by 90°.

15 Claims, 5 Drawing Sheets

ELECTRONIC INPUT/OUTPUT MODULE

BACKGROUND OF THE INVENTION

1. Field of the Invention

The invention relates to an input/output module with a terminal unit for connection of sensors or actuator with an electronic unit and with a bus connection element. In particular, the invention relates to such an input/output module with a terminal unit having at least one input/output located in the same plane and being connected by the electronic unit to a bus connection element.

2. Description of Related Art

Until a few years ago, industrial cabling of sensors and actuators was done solely by parallel cabling of each individual sensor or actuator via individual leads. The increasing number of sensors and actuators which are currently being used in industrial installations is also raising costs in the cabling of individual sensors and actuators via individual leads. Cabling has required larger and more complex switchgear cabinets in which all leads come together. Expensive installation and start-up efforts necessarily require high personnel costs, and at the same time, represent an increased fault risk. Additionally, the cost of replacement of detective sensors or actuators or their renewal is increasing.

In addition to signal transmission via leads laid in parallel, therefore, in complex automation engineering, serial signal transport via bus systems has become increasingly common as a money-saving alternative. In addition to wires for data transmission, in these bus systems, supply for connected sensors and actuators is entailed. Bulky, complex switchgear cabinets which are thus expensive to wire are eliminated and are replaced by smaller, decentralized input/output modules.

Serial signal transport via bus systems makes the connection of individual sensors and actuators to one another and to the control simpler and also reduces costs in installation and startup. However, replacement of defective input/output modules or their renewal is still relatively complex, thus time-consuming and costly. In addition, the user is forced more and more often to change existing facilities and replace parts of the connection hardware to adapt them to the new conditions.

SUMMARY OF THE INVENTION

Thus, the object of this invention is to improve the initially mentioned input/output module such that installation and start up can be easily done and the electronics of the input/output module can be easily modified so that the input/output module can be adapted to altered requirements.

The aforementioned object is achieved, according to the invention, by the fact that the terminal unit is mounted on the electronic unit, and in order to replace the electronic unit, the terminal unit can be removed from the electronic unit without the need to remove lines connected to the inputs/outputs. This type of modularity allows adaptation of the input/output module to the altered requirements and repair of the electronic unit by its replacement with the wiring intact.

The input/output module is configured especially advantageously such that the terminal unit can be connected in two different positions to the electronic unit so that the input/outputs of the terminal unit in the two positions lie in planes offset by roughly 90 degrees to one another. In this way greater flexibility in the installation of lines for sensors and actuators is achieved. If the input/output module is, for example, attached to a wall, the lines of the sensors and actuators can be routed to the input/output module, both from the front and top and also from the front and bottom. Advantageously, the aforementioned input/output module is further improved by the electronic unit being able to determine in which of the two different positions the terminal unit is connected to the electronic unit and to adapt itself accordingly. In this way, when the terminal unit is rearranged, subsequent manual adaptation of the electronics is unnecessary, so that the advantage of flexibility of the connection directions of the lines by the possibility of rearrangement is not bought at the expense of higher costs in adaptation of the electronics.

As the bus line to which the bus connection unit is connected, both an optical fiber as well as a conventional copper cable and any other electrical cable can be used. If a fiber optic cable is used as the bus line, the bus connection element advantageously has a holding block into which the fiber optic cable can be inserted. According to another teaching of the invention, there is at least one optical coupling element in the bus connection unit; the contact face of the former interacts with the fiber optic cable by inserting the holding block into the bus connection element.

Connection of a fiber optic cable to the input/output module of the invention is especially simple when, according to another teaching of the invention, the bus connection element has a cutting edge and the cutting edge cuts off the end of the fiber optic cable when the holding block, which routes the fiber optic cable, is pushed into the bus connection element.

If an electrical line is used as the bus line, for example, a copper cable, the bus connection element of the input/output module of the invention advantageously has an opening for holding at least one electrical line and contact tongues which penetrate the electrical line are attached within the bus connection element.

These and further objects, features and advantages of the present invention will become apparent from the following description when taken in connection with the accompanying drawings which, for purposes of illustration only, show several embodiments in accordance with the present invention.

DETAILED DESCRIPTION OF THE INVENTION

Figure 1:
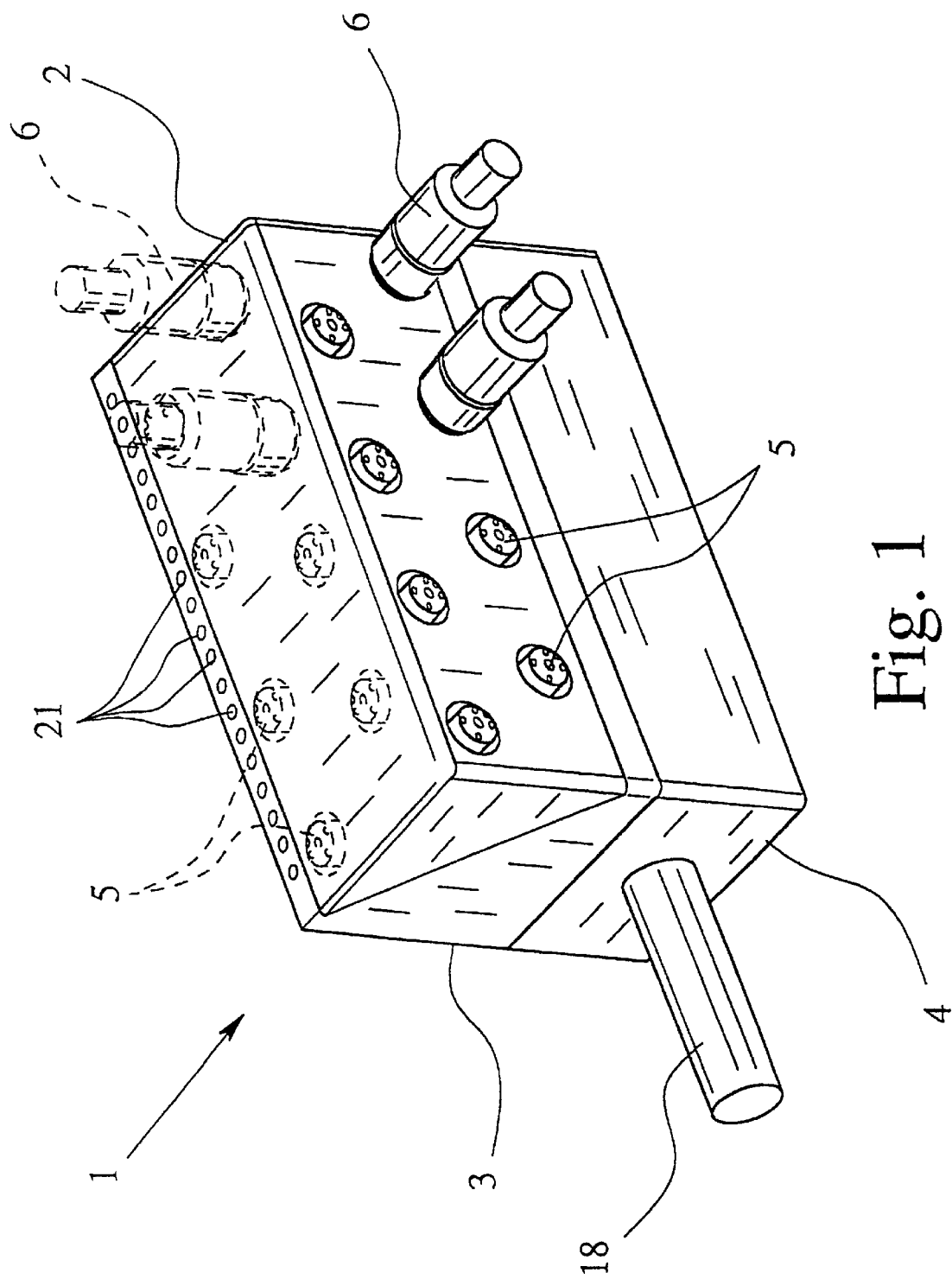
FIG. 1 shows an input/output module with a connected bus line.

FIG. 1 shows an input/output module 1 which is comprised of a terminal unit 2, an electronic unit 3 and a bus connection element 4. The input/output module 1 is rectangular overall, the bus connection element 4 likewise being rectangular and the terminal unit 2 and electronic unit 3 each being triangular. The terminal unit 2 and electronic unit 3 are connected to one another such that, together, they form a rectangular body. On one of the two surfaces of the terminal unit 2 that is accessible from the outside there are input/outputs 5. The lines 6 from the unillustrated sensors and actuators are connected to these outputs 5.

The terminal unit 2 is made such that it can be slipped onto the electronic unit 3 in either of two positions in which the inputs/outputs 5 lie in respective planes that are offset by roughly 90° with respect to each other, and then secured thereto by screws with electrical connectors of the electronic unit engaged with corresponding electrical connectors on the terminal unit; As electrical connectors, plug and socket connectors, plug-in, clip-fastened, snap-on/in or any other type of connector can be used, although a plug and socket or lead type connector 13 is expected to normally be used. In the input/output module 1, as is shown in FIG. 1, this means that the inputs/outputs 5 can point not only forward, as is shown by the solid line representation, but when the terminal unit 2 is slipped onto the electronic unit 3 after being appropriately turned, the input/outputs 5 can also point upwards, as shown there in phantom outline. Thus, the lines 6 can be connected here to inputs/outputs 5 both from the front and also from the top by simply rearranging the terminal unit 2.

Since, turning of terminal unit 2 from the solid line mounting position to the phantom lined position results in the inputs/outputs to which lines 6 are connected in the solid line position assuming the position of the two inputs/outputs to which the lead lines for reference numeral 5 run in the phantom line position, advantageously, the input/output module 1 is further improved by the electronic unit 3 being able to identify which of the two different positions in which the terminal unit is connected to the electronic unit, so that the connecting function served by those inputs/outputs can be recognized as now being associated the different inputs/outputs to which lines 6 are shown in the phantom outline position. This can be done, for example, by the provision of an asymmetrically located contact being provided on the terminal unit 2 which engages a respective one of two different correspondingly located contacts on the electronic unit 3 in each of the two positions, or vice versa. In this way, when the terminal unit 2 is rearranged, subsequent manual adaptation of the electronics is unnecessary, so that the advantage of flexibility of the connection directions of the lines by the possibility of rearrangement is not bought at the expense of higher costs in adaptation of the electronics. This asymmetric contact may be an additional separate contact or can be integrated into one of the connectors used as inputs/outputs.

Figure 2A:
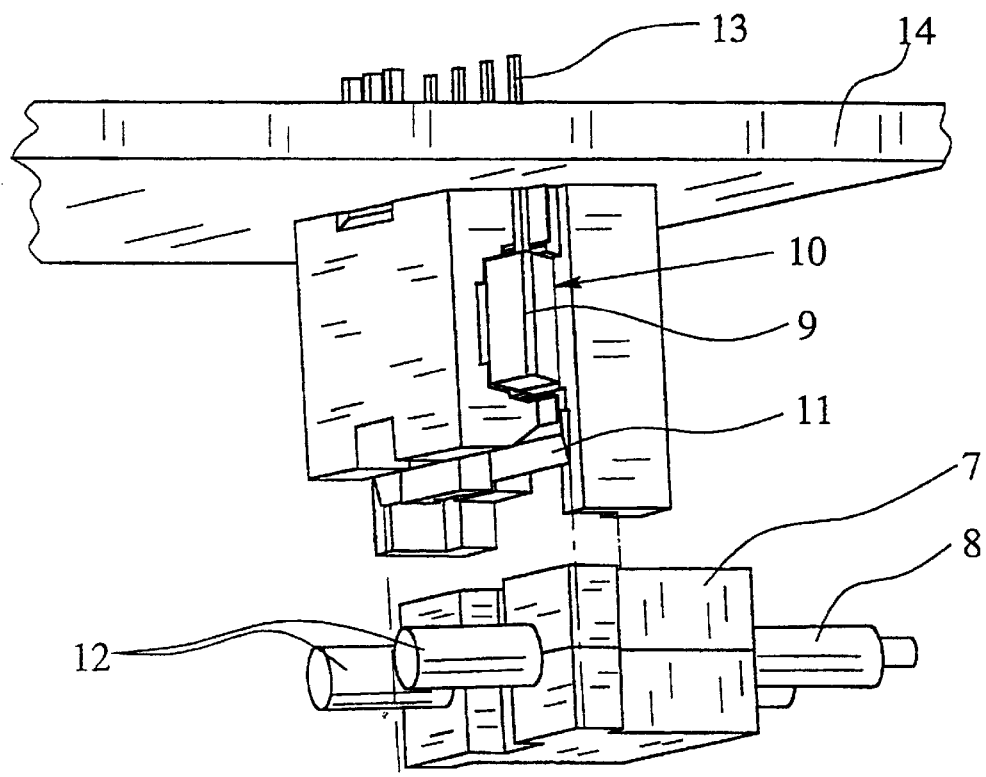
FIG. 2a shows one embodiment of a bus connection element of an input/output module in which optical fibers are used as the bus lines, in the premounted state.
Figure 2B:
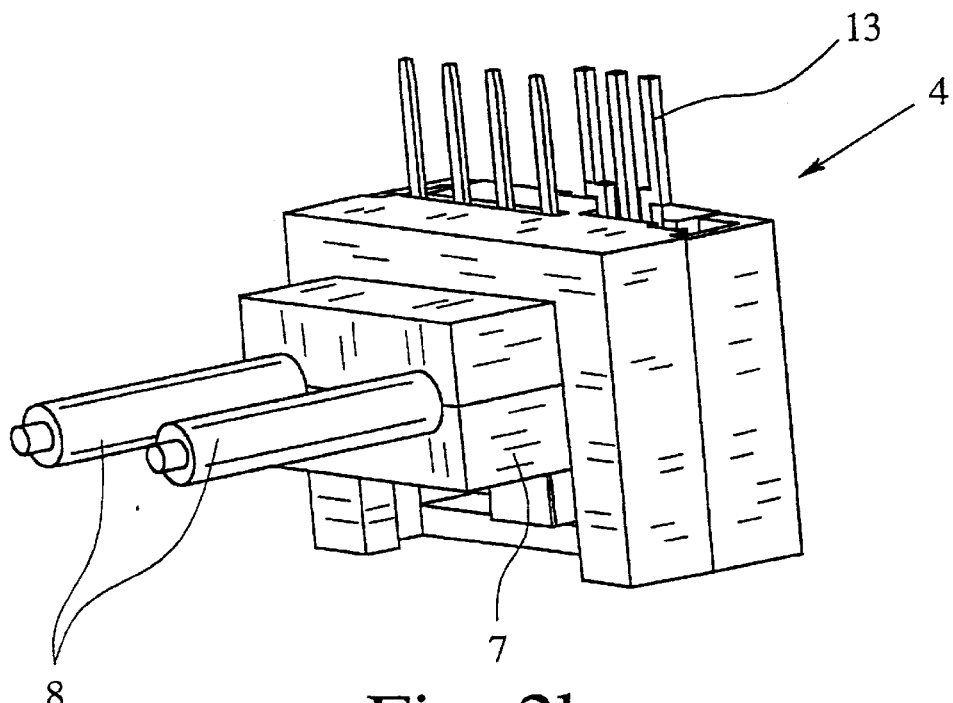
FIG. 2b shows the bus connection element from FIG. 2a after the fiber optic cables have been connected.

FIGS. 2a and 2b show a bus connection element 4 in which fiber optic cables 8 are inserted in a holding block 7. The holding block 7 is used not only to hold fiber optic cables 8 but, at the same time, provide strain relief for the fiber optic cables 8. The bus connection element 4 contains an optical coupling element 9; to transmit signals, the fiber optic cables 8 interact with contact faces 10 of the coupling element 9. In the premounted state of FIG. 2a, a cutting edge 11 is visible which lies in the same plane with the contact faces 10 of the optical coupling element 9. If the holding element 7 with the fiber optic cables 8 is inserted into the bus connection element 4, the ends 12 of the fiber optic cables 8 are cut off by the edge 11. In this way, exact positioning of the face of the fiber optic cable 8 in front of the contact face 10 of the optical coupling element 9 is achieved. The optical coupling element 9 is connected to the electronic unit 3 (which is not shown in this figure) via electrical terminal leads 13. The electronic unit 3 is in the assembled state of the input/output module 1 on a circuit board 14 which forms the upper termination of the bus connection element 4.

Figure 3:
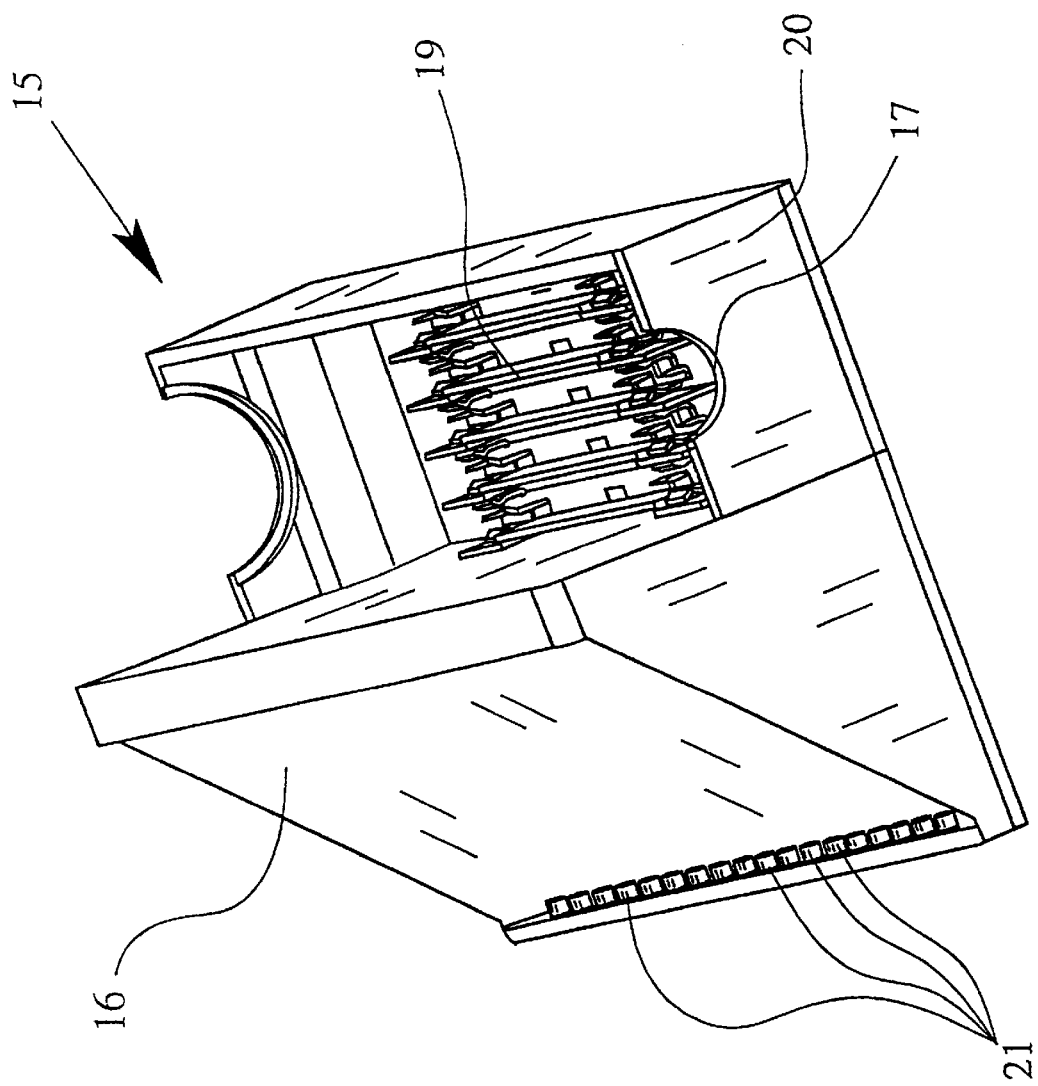
FIG. 3 shows parts of the housing of an input/output module in which electrical lines are used as the bus line.
Figure 4:
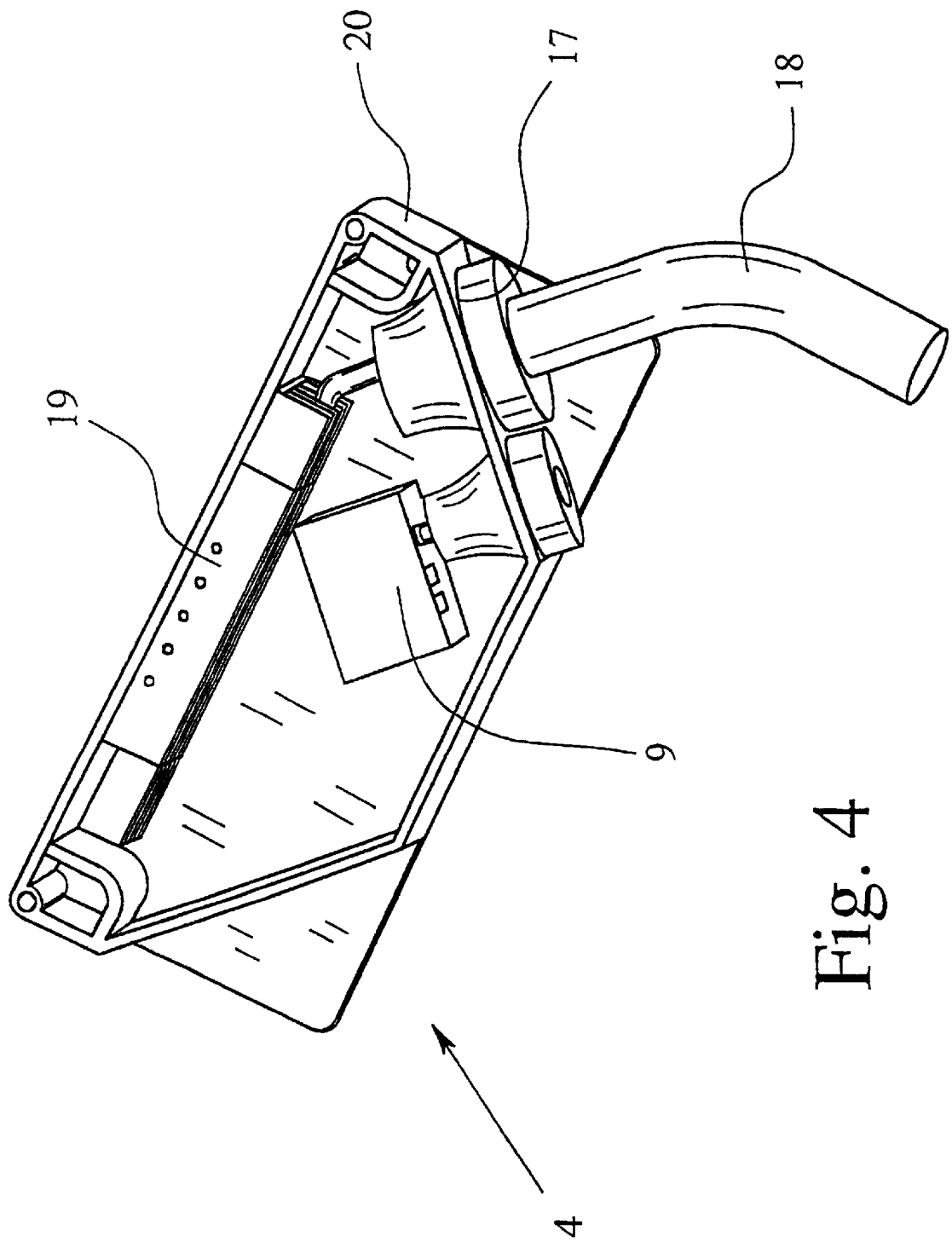
FIG. 4 shows another embodiment of a bus connection element.

FIG. 3 shows a part of the housing of the input/output module 1, specifically a half 15 of the bus connection element 4 and the housing 16 of the electronic unit 3. The bus connection element 4, of which only half 15 is shown here, has an opening 17 for holding an electrical line 18. Within the bus connection element 4, there are contact tongues 19 which provide for electrical contact between the input/output module 1 and the electrical line 18. These contact tongues 19 have the advantage that an electrical line 18, as is shown in FIGS. 1 & 4, therefore needs simply be inserted into the opening 17 of the bus connection element 4. The contact tongues 19 penetrate the jacketing of the electrical line 18 into the copper cable. Thus, it is not necessary to screw or clamp the electrical line 18.

In FIG. 3, the opening 17 is located on one of the two shorter outside surfaces 20 of the bus connection element 4. In the bus connection element 4, as is shown in FIG. 4, there is an opening 17 in a plane which is offset by 45° relative to the outside surface 20. In this way, a simple connection of the electrical line 18 is possible regardless of whether it is routed parallel or perpendicular to the longitudinal direction of the bus connection element 4.

On one longitudinal side of the electronic unit 3, as shown in FIGS. 1 and 3, there are several light emitting diodes 21 which are used for visual checking of all inputs/outputs 5 of the terminal unit 2. If all inputs/outputs 5 are protected against short circuit independently of one another, a short circuit of one input/output 5 can be displayed by a change in the color of the corresponding light emitting diode 21 on the input/output module 1. By means of corresponding interconnection of the electronic unit 3, the three-dimensional allocation between the individual inputs/outputs 5 and the light emitting diodes 21 corresponding thereto is preserved even when the orientation of terminal unit 2 is rearranged relative to the electronic unit 3.

Figure 5:
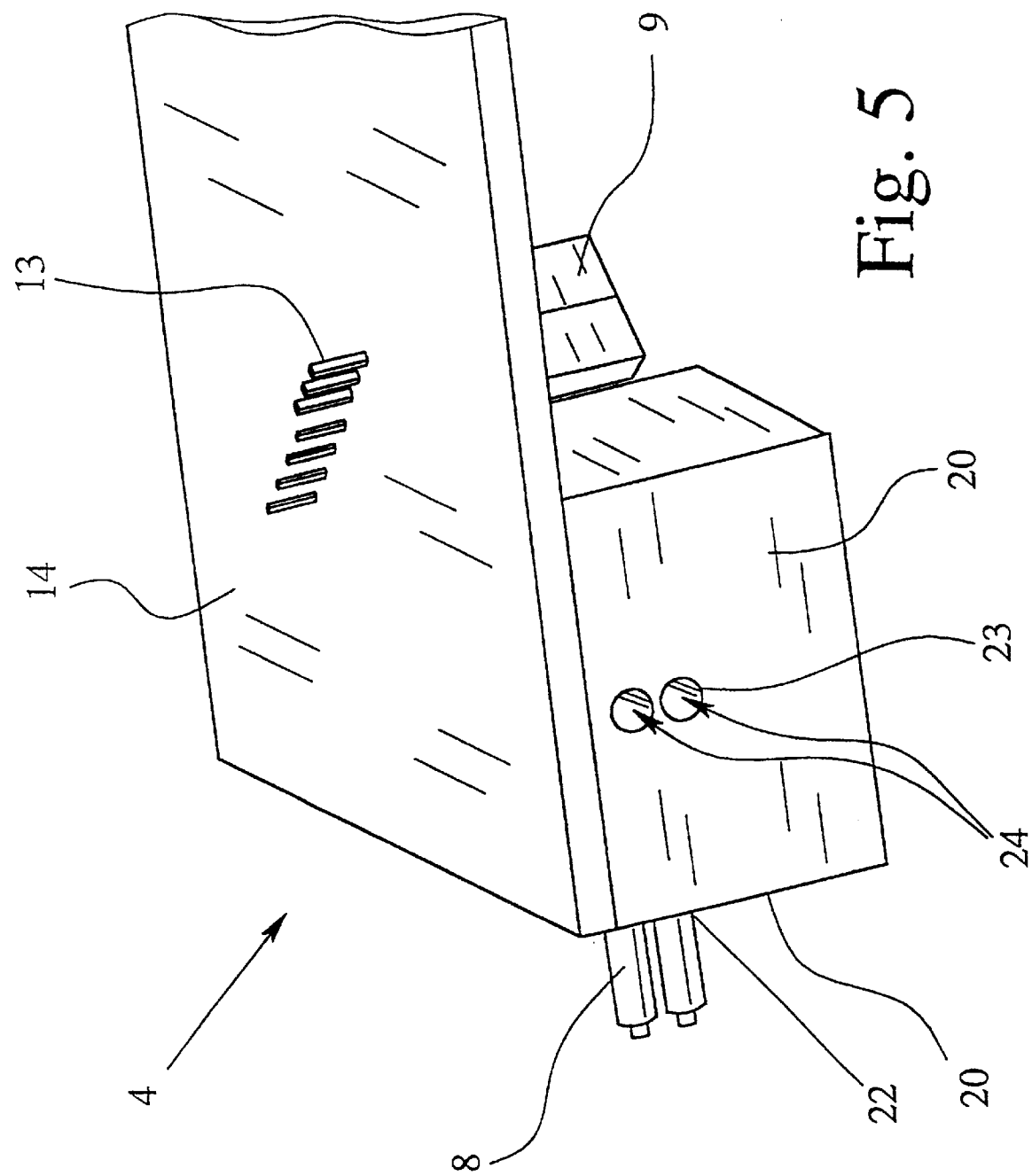
FIG. 5 shows one embodiment of a bus connection element which is alternative to the embodiment as shown in FIGS. 2a and 2b for an input/output module in which fiber optic cables are used as the bus lines.

FIG. 5 shows a bus connection element 4 with an optical coupling element 9 in which the fiber optic cable 8 can be inserted into different openings 22, 23 and the openings 22, 23 are located in outside surfaces 20 which are perpendicular to one another. Here again, there is the possibility of a simple connection of the fiber optic cable 8 to the input/output module 1, even if the fiber optic cable 8 is routed to the input/output module 1 from two directions that are perpendicular to one another. However, since in the embodiment of bus connection element 4 as shown in FIG. 5, in contrast to the embodiment of the bus connection element 4 as is shown in FIGS. 2a and 2b, there is no cutting edge 11, here, before insertion of the fiber optic cable 8 into the openings 22 and 23, the face of the fiber optic cable 8 must be pre-treated. The fiber optic cable 8 is guided to the optical coupling element 9 via channels 24 within the bus connection element 4.

Instead of a fiber optic cable 8, electrical lines 18 can also be routed through openings 22 and 23 and channel 24 to a terminal site of the bus connection element 4. Then, in place of the optical coupling element 9 shown in FIG. 5 there are the contact tongues 19 as shown in FIGS. 3 and 4.

As can be seen from the foregoing, the input/output module is constructed to enable the terminal unit to be removed from the electronic unit, to replace the electronic unit, without the need to remove lines connected to the inputs/outputs. This type of modularity allows adaptation of the input/output module to the altered requirements and repair of the electronic unit by its replacement with the wiring intact. At the same time, the input/output module is constructed so as to satisfy at least protection class IP 65.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

We claim:

1. Input/output module with a terminal unit for connection of sensors or actuators, comprising:

an electronic unit, a bus connection element, and a terminal unit having at least one input/output located in a surface thereof, the terminal unit being connected by the electronic unit to the bus connection element;

wherein the terminal unit is mounted on the electronic unit, wherein the terminal unit is removable from the electronic unit without the need to remove lines connected to the inputs/outputs of the terminal unit in order to replace the electronic unit; and wherein the terminal unit is connectable to the electronic unit in two different positions, and wherein the at least one input/output of the terminal unit lies in a respective plane in each of the two positions, said planes being offset by roughly 90 degrees relative to one another.

2. Input/output module as claimed in claim 1, wherein the electronic unit has means for recognizing which of the two different positions the terminal unit is connected to the electronic unit and adapting itself accordingly.

3. Input/output module as claimed in claim 2, wherein said means for recognizing comprises an asymmetric contact on one of the terminal unit and the electronic unit which makes contact with a respect one of two contacts on the other of the terminal unit and the electronic unit in each of said two different positions.

4. Input/output module as claimed in claim 1, wherein the input/output module as a whole and the bus connection unit by itself are essentially rectangular; wherein the terminal unit and the electronic unit are each roughly triangular; and wherein the electronic unit and the terminal unit connected together are roughly rectangular.

5. Input/output module as claimed in claim 4, wherein the bus connection element has a holding block into which a fiber optic cable, as a bus line, is insertable.

6. Input/output module as claimed in claim 5, wherein the bus connection element has at least one optical coupling element and the fiber optic cable interacts with a contact face of the optical coupling element upon insertion of the holding block into the bus connection element.

7. Input/output module as claimed in claim 6, wherein the bus connection element has a cutting edge for cutting off an end of the fiber optic cable when the holding block with the fiber optic cable therein is pushed into the bus connection element.

8. Input/output module as claimed in claim 1, wherein the electronic unit has light emitting diodes for visual checking of all inputs/outputs of the terminal unit.

9. Input/output module as claimed in claim 1, wherein the bus connection element for has openings for holding at least one bus line on two outer surfaces thereof which are perpendicular to one another; and wherein channels are provided within the bus connection element for guiding the at least one bus line to a terminal site within the bus connection element.

10. Input/output module with a terminal unit for connection of sensors or actuators, comprising:

an electronic unit, a bus connection element, and a terminal unit having at least one input/output located in a surface thereof, the terminal unit being connected by the electronic unit to the bus connection element;

wherein the terminal unit is mounted on the electronic unit, wherein the terminal unit is removable from the electronic unit without the need to remove lines connected to the inputs/outputs of the terminal unit in order to replace the electronic unit; and wherein the bus connection element has a holding block into which a fiber optic cable, as a bus line, is insertable.

11. Input/output module as claimed in claim 10, wherein the bus connection element has at least one optical coupling element and the fiber optic cable interacts with a contact face of the optical coupling element upon insertion of the holding block into the bus connection element.

12. Input/output module as claimed in claim 11, wherein the bus connection element has a cutting edge for cutting off an end of the fiber optic cable when the holding block with the fiber optic cable therein is pushed into the bus connection element.

13. Input/output module with a terminal unit for connection of sensors or actuators, comprising:

an electronic unit, a bus connection element, and a terminal unit having at least one input/output located in a surface thereof, the terminal unit being connected by the electronic unit to the bus connection element;

wherein the terminal unit is mounted on the electronic unit, wherein the terminal unit is removable from the electronic unit without the need to remove lines connected to the inputs/outputs of the terminal unit in order to replace the electronic unit; and wherein the bus connection element has an opening for holding an electrical line and within the bus connection element contact tongues are attached for penetrating the electrical line.

14. Input/output module as claimed in claim 13, wherein an opening of the bus connection element lies in a plane which is offset by 45° relative to an outer surface of the bus connection element.

15. Input/output module as claimed in claim 13, wherein said opening in the bus connection element opens externally through an outside wall of the bus connection element for holding an external electrical line inserted into the bus connection element; and wherein said contact tongues are shaped for piercing an external jacketing of the electrical line.

* * * * *